US012799622B2

(12) United States Patent
Hardage et al.

(10) Patent No.: US 12,799,622 B2
(45) Date of Patent: Nov. 17, 2026

(54) VORTEX CRYSTALLIZER AND METHOD

(71) Applicant: Buffalo Potash Corp., Martensville (CA)

(72) Inventors: Quinton Hardage, Saskatoon (CA); Stephen Philip Halabura, Martensville (CA); Irwin Ewen, Saskatoon (CA); Jared Galenzoski, Moose Jaw (CA); Mohsen Bayati, Calgary (CA)

(73) Assignee: Buffalo Potash Corp., Martensville (CA)

( * ) Notice: Subject to any disclaimer, the term of this patent is extended or adjusted under 35 U.S.C. 154(b) by 325 days.

(21) Appl. No.: 18/466,328

(22) Filed: Sep. 13, 2023

(65) Prior Publication Data

US 2024/0084477 A1 Mar. 14, 2024

Related U.S. Application Data

(60) Provisional application No. 63/375,596, filed on Sep. 14, 2022.

(51) Int. Cl.
*C30B 7/08* (2006.01)
*C30B 35/00* (2006.01)

(52) U.S. Cl.
CPC .............. *C30B 7/08* (2013.01); *C30B 35/007* (2013.01)

(58) Field of Classification Search
CPC ................................ C30B 7/08; C30B 35/007
See application file for complete search history.

(56) References Cited

U.S. PATENT DOCUMENTS

| | | | | | |
|---|---|---|---|---|---|
| 1,952,281 | A | | 3/1934 | Georges et al. | |
| 3,236,590 | A | * | 2/1966 | Sopchak | C01D 7/00 23/302 R |
| 3,314,748 | A | * | 4/1967 | Port | C01D 7/35 423/426 |
| 3,350,296 | A | * | 10/1967 | Torobin | B01D 9/0009 494/901 |
| 3,442,801 | A | * | 5/1969 | Anderson | C02F 1/22 210/189 |
| 3,474,849 | A | * | 10/1969 | Inchausti | B01D 9/0009 159/4.06 |
| 9,822,013 | B1 | | 11/2017 | Mcewan et al. | |
| 2021/0013125 | A1 | | 1/2021 | North et al. | |
| 2021/0131255 | A1 | | 5/2021 | Fettis et al. | |

FOREIGN PATENT DOCUMENTS

| | | | | | |
|---|---|---|---|---|---|
| CA | 866570 | | | 3/1971 | |
| PL | 190519 | B1 | * | 12/2005 | |
| WO | WO-02089942 | A1 | * | 11/2002 | B01F 31/85 |

OTHER PUBLICATIONS

Liu et al., "Influence of agitation intensity on solution stability for rapidly grown KDP crystal through theoretical and experimental research" Materials today Communications vol. 24 Feb. 2020.*

* cited by examiner

*Primary Examiner* — Robert M Kunemund
(74) *Attorney, Agent, or Firm* — Craig J. Lervick; Larkin Hoffman Daly & Lindgren, Ltd.

(57) ABSTRACT

Methods for crystallizing soluble minerals from a brine stream are provided. Soluble minerals dissolved in a saturated brine stream can enter a crystallizer in liquid form and exit the crystallizer in crystal (solid) form. The crystallizer is able to do this by cooling the brine stream using atmospheric air.

26 Claims, 3 Drawing Sheets

VORTEX CRYSTALLIZER AND METHOD

FIELD

The present invention relates to crystallization devices and methods, and specifically to crystallization devices and methods employed for crystallizing desired minerals from solutions, such as those obtained from solution mining.

BACKGROUND

It is known in the mining industry that the crystallization of desired minerals from solutions derived from solution mining operations typically employ multiple evaporation and/or cooling stages which may involve force or vacuum crystallization in order to produce a crystallized material with large enough crystal size to be used for economic purposes. These methods are very energy intensive and may not be well suited for mineralized solutions that are highly saturated with a desired mineral.

Some crystallizers employ evaporative cooling as a heat exchange mechanism for forming a saturated solution that is disposed to crystallization of the dissolved minerals. There are, however, known drawbacks to using evaporative cooling as a means for crystallization of desired minerals. For example, the temperature differential between the feed solution entering the crystallizer and the ambient surface temperature may not be sufficient thus causing lower crystallization yields. These situations would be more prevalent when ambient air temperatures are warmer, such as in the summer, and less prevalent when ambient air temperatures are colder, such as in the winter season in Canada or elsewhere.

According to an aspect, crystallizers and methods for crystallizing desired minerals from a solution may employ evaporative cooling means despite unfavorable ambient air temperatures at the surface.

SUMMARY

According to any aspect, there is provided a device for crystallizing a product from a solution containing the product, the device comprising:

- a vessel comprising a cooling region;
- an inlet configured to allow the solution to enter the vessel;
- a circulator for circulating the solution inside the vessel such that at least a portion of the solution is circulated inside the cooling region;
- a cooler for subjecting at least a portion of the solution, while inside the cooling region of the vessel, to a gas maintained at a temperature below the temperature of at least a portion of the solution thereby causing evaporative cooling of at least a portion of the solution allowing at least a portion of the solution to be saturated with the product and crystals of the product to form;
- a discharge for withdrawing the crystals of the product from at least a portion of the solution;
- a stirrer for stirring the product in the bottom of the vessel; and
- an outlet for discharging at least a portion of the solution from the vessel.

In some aspects, the gas may comprise at least one of: an ambient air, air derived from a compressed air, air derived from the compressed air that has passed through an adjustable vortex tube and has exited a cool end of the vortex tube, or any combination thereof.

In some exemplary embodiments, the device comprises a sensor and control system for determining whether the ambient air temperature is too high or too low to cause a desired amount of evaporative cooling of at least a portion of the solution. When the control system determines that the ambient air temperature is too high or too low to cause the desired amount of evaporative cooling of at least a portion of the solution, then the proportions of ambient air and other gas components in the gas are adjusted manually or by the control system accordingly. A control and monitoring system is provided that is configured for determining whether the ambient air temperature is too high or too low to cause the desired amount of evaporative cooling of at least a portion of the solution. In some embodiments, the vortex tubes are adjusted accordingly utilizing a valve located on the hot end of the tube to release cooled air from the cool end of at least one vortex tube at an appropriate temperature for maximizing crystallization.

For example, when the control system determines that a temperature differential between at least a portion of the solution and ambient air is not sufficient for evaporative cooling, then the gas may be comprised of ambient air and compressed air that has passed through the adjustable vortex tube to deliver cooler air, such that the temperature differential between the gas and at least a portion of the solution is sufficient for efficient evaporative cooling. When the control system determines that the temperature differential between at least a portion of the solution and ambient air is sufficient for evaporative cooling, then the gas is comprised substantially or solely of ambient air. Additionally, or alternatively the vortex tubes are adjusted to reduce the cooling effect on the air stream.

In some exemplary embodiments, the device comprises sensors for monitoring parameters such as, but not limited to, temperature, mineral concentrations and flow rates at certain regions and components of the device and/or at areas related to the device. Data from the sensors is provided, either via wired or wireless means, to a control and monitoring system. The control and monitoring system is configured for determining at least one optimal operating parameter based on the monitored parameters and any user imputed limitations, and determining control instructions based on the determined at least one optimal operating parameter. The control and monitoring system is also configured to send a signal comprising control instructions, via wired or wireless means, to means for controlling certain aspects of the device.

In one aspect, the control and monitoring system can be configured to automatically send the signal to the control means in response to the monitored parameters. The control and monitoring system may employ algorithms or other means for determining optimal operating parameters of the device based on the monitored parameters such that the control instructions are based on determined optimal operating parameters.

In another aspect, there is provided a method for crystallizing a product from a solution containing the product, the method comprising the steps of:

- providing a vessel comprising a cooling region;
- allowing the solution to enter the vessel;
- circulating the solution inside the vessel such that at least a portion of the solution is circulated inside the cooling region;
- subjecting at least a portion of the solution, while inside the cooling region of the vessel, to a gas maintained at a temperature below the temperature of at least a portion of the solution thereby causing evaporative cooling of at least a portion of the solution allowing at least a portion of the solution to be supersaturated with the product and crystals of the product to form;

withdrawing the crystals of the product from at least a portion of the solution; and discharging at least a portion of the solution from the vessel.

In some exemplary embodiments, the gas comprises ambient air, air derived from compressed air, air derived from compressed air that has passed through an adjustable vortex tube and has exited a cool end of the vortex tube, or any combination thereof.

In some exemplary embodiments, the method further comprises the step of determining whether the ambient air temperature is too high or too low to cause a desired amount of evaporative cooling of the at least a portion of the solution. When it is determined that the ambient air temperature is too high or too low to cause the desired amount of evaporative cooling of at least a portion of the solution, then the proportions of ambient air and other gas components in the gas are adjusted manually or by a control means accordingly. Preferably, a control and monitoring system is provided that is configured for determining whether the ambient air temperature is too high or too low to cause the desired amount of evaporative cooling of the at least a portion of the solution.

For example, when it is determined that the temperature differential between the at least a portion of the solution and ambient air is not sufficient for evaporative cooling, then the gas may be comprised of ambient air and compressed air that has passed through the adjustable vortex tube to deliver cooler air, such that the temperature differential between the gas and at least a portion of the solution is sufficient for efficient evaporative cooling. When it is determined that the temperature differential between the at least a portion of the solution and ambient air is sufficient for evaporative cooling, then the gas will be comprised substantially or solely of ambient air. Additionally, or alternatively the vortex tubes are adjusted to reduce the cooling effect on the air stream.

In some exemplary embodiments, the method further comprises the steps of:

monitoring parameters such as, but not limited to, temperature, mineral concentrations and flow rates at certain regions and components of the device and/or at areas related to the device;

providing information based on the monitored parameters, either via wired or wireless, to a control and monitoring system;

determining at least one optimal operating parameter, at the control and monitoring system, based on the monitored parameters and any user imputed limitations;

determining control instructions, at the control and monitoring system, based on the determined at least one optimal operating parameter.

sending a signal, from the control and monitoring system, comprising the control instructions, via wired or wireless means, to control means; and allowing the control means to control certain aspects of the device based on the control instructions.

The control and monitoring system can be configured to automatically send the signal to the control means in response to the monitored parameters. The control and monitoring system may employ algorithms or other means for determining optimal operating parameters of the device based on the monitored parameters such that the control instructions are based on determined optimal operating parameters.

A detailed description of exemplary embodiments of the present invention is given in the following. It is to be understood, however, that the invention is not to be construed as being limited to these embodiments. The exemplary embodiments are directed to particular applications of the present invention, while it will be clear to those skilled in the art that the present invention has applicability beyond the exemplary embodiments set forth herein.

BRIEF DESCRIPTION OF THE DRAWINGS

In the accompanying drawings, which illustrate exemplary embodiments of the present invention.

DETAILED DESCRIPTION

Throughout the following description specific details are set forth in order to provide a more thorough understanding to persons skilled in the art. However, well known elements may not have been shown or described in detail to avoid unnecessarily obscuring the disclosure. The following description of examples of the technology is not intended to be exhaustive or to limit the invention to the precise form of any exemplary embodiment. Accordingly, the description and drawings are to be regarded in an illustrative, rather than a restrictive, sense.

The present invention is directed to improvements of crystallizers 100 that employ evaporative cooling for forming saturated solutions of desired product that are disposed to crystallization of the desired product. The present invention may employ the use of adjustable components in conjunction with sensors, control and monitoring systems, and automated control systems 308 allow for optimal crystallization yields of a desired product. The present invention may also or alternatively employ the use of a cooling system to assist in evaporative cooling of a feed solution, allowing for better crystallization yields of a desired product despite unfavorable ambient air temperatures, such as in the summer.

Figure 1:
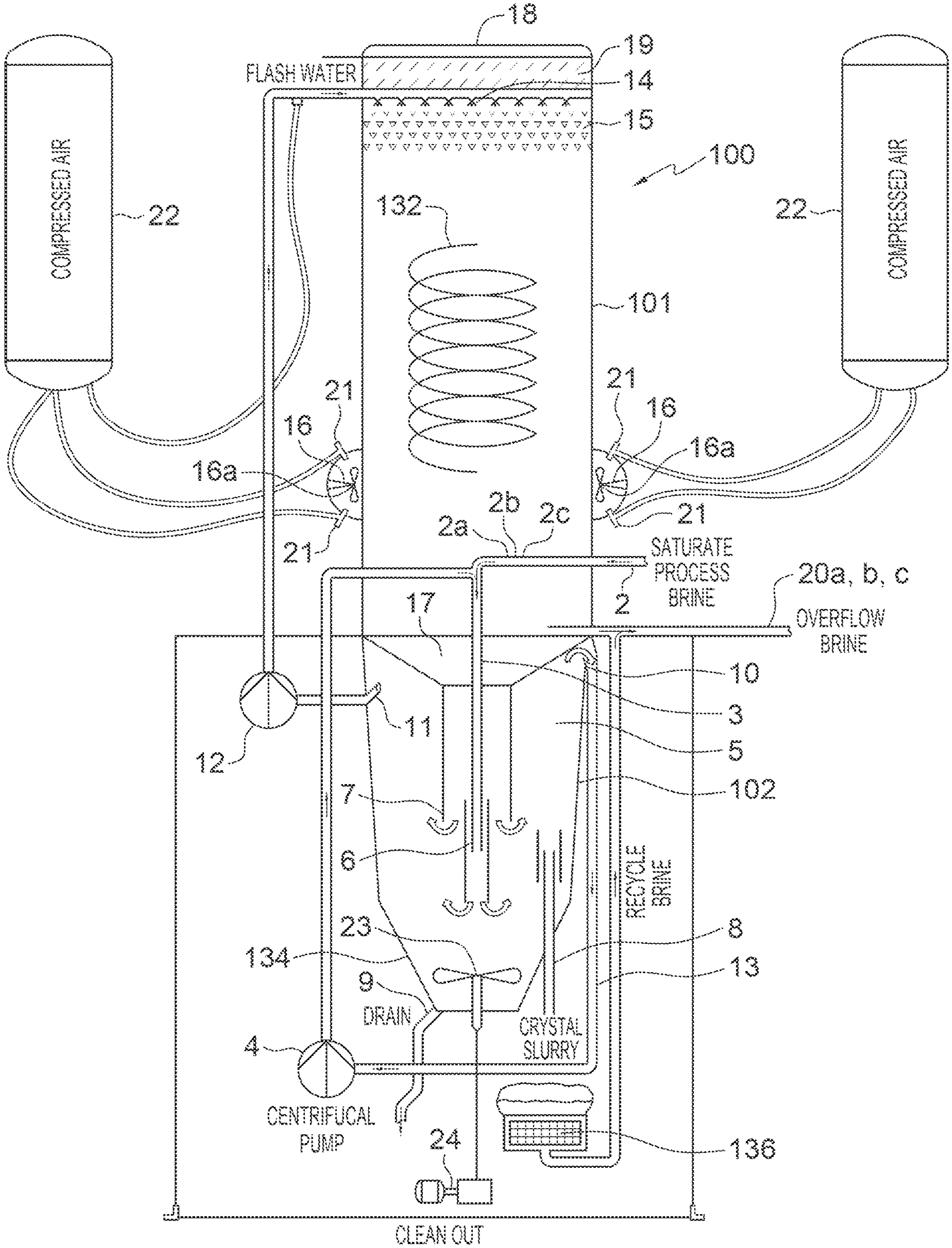
FIG. 1 is a schematic illustration of a crystallizer.

In FIG. 1, a crystallizer is shown 100, comprising a vessel 5 having a generally cylindrical cooling tower 101 is connected with a generally conical bottom collecting portion 102 (e.g. collector) of the vessel 5. In this aspect, the cooling tower 101 is positioned above the collecting portion 102. A process brine inlet pipe 2 is provided that is configured for allowing a feed solution to enter the vessel 5 generally between the cooling tower portion 101 and the bottom collecting portion 102.

The feed solution may be a mining solution comprising a desired mineral derived from solution mining operations of a mineral containing strata that may be stored in a surface tank or pond (not shown) before being transferred (by gravity, pumped, siphoned, or otherwise) into the vessel 5. The feed solution may be a higher temperature than an ambient air temperature (and the related wet bulb temperature) at the surface of the ambient environment.

The vessel 5 may have a flow control device 308 configured to open or close thereby allowing more or less feed solution to enter the inlet pipe 2 and the vessel 5. The inlet pipe 2 may have a wireless electromagnetic flowmeter sensor 2*a* for measuring an amount of fluid flowing through the inlet pipe 2, a wireless temperature sensor 2*b* for measuring a solution temperature, and a wireless salt (e.g. NaCl) concentration sensor 2*c* for measuring or determining a concentration of sodium chloride in the feed solution before the feed solution is introduced into a top portion of a downcomer pipe 3 which extends downwardly from the inlet pipe 2 and is open at a lower or bottom end below a crystal magma bed 7. In this aspect, the downcomer pipe 3 may follow a central axis of the collector 102.

A circulation system circulating a circulatory solution, lower in temperature than the feed solution, that is provided and mixed with the feed solution as the feed solution enters the downcomer pipe 3, thereby forming a first saturated solution. Saturation (of the first saturated solution) is attained as the feed solution transfers its heat content to the circulatory solution while streaming downwards within the downcomer pipe 3. The flow control device 308 may be typically configured to allow an amount of feed solution to enter the vessel 5 such that the first saturated solution is composed of a ratio of about 1:10 to about 1:60 of the feed solution to the circulatory solution. The ratio is dependent on one or more evaporative conditions. For some embodiments, about 0.5 $m^3$ of the feed solution may be added to about 5 $m^3$ and 30 $m^3$ of the circulatory solution that may already be inside the crystallizer 100.

A circulation pump 4, such as a centrifugal pump, maybe provided for circulating the circulatory solution. The circulation pump 4 may also cause the first saturated solution to flow through the lower opening of the downcomer pipe 3 toward a conical bottom 134 of the vessel 5 where one or more vessel sensors may be employed akin to that described for the sensors 2*a*, 2*b*, 2*c* on the inlet pipe 2. The first saturated solution then ascends upwards to a crystal magma bed 7 held in suspension where crystallization of the desired minerals occurs. Within the suspended crystal magma bed 7, a sorting of crystal sizes occurs, wherein the larger crystals tend to move towards the base of the crystal magma bed 7 while the smaller crystals float to the top of the crystal magma bed 7. The first saturated solution holds the crystal magma bed 7 in suspension and at a desired level. The crystal magma bed 7 is the region of the highest saturation of, for example, potassium chloride (KCl) and/or other minerals capable of crystallization and through evaporative cooling, and resultant supersaturation, crystals start to form at or above the crystal magma bed and under the force of gravity move down into the bed. As crystallization continues, the crystals grow larger and migrate to the bottom of the crystal magma bed 7. Crystal size can be controlled by altering a retention time inside the crystallizer 100 and crystal magma bed 7 by removing more or less solids and brine as required from the vessel 5.

Under certain conditions, an additional mixer or agitator 23 and motor 24 may be added to the bottom of the collector 102. The agitator 23 ensures mixing of the crystal magma bed 7, increasing the sorting of the crystal sizing. The agitator 23 includes a hub for attachment to an agitator shaft, and at least two agitator blades which are connected to the hub and extend in a radial direction for rotation about an axis, with the agitator blade angled in relation to the axis. Each agitator blade has a free end, with a fin being provided in an area of the free end of the agitator blade and extending in a substantial parallel relationship to a direction of the axis away from the agitator shaft. The agitator 23 can be rotated by the motor 24. The agitator 23 may provide a generally upward flow within the collector 102.

A telescopic tube 6 may be provided, extending from the downcomer pipe 3 that may alter the flow of the first saturated solution by extending up or down relative to the downcomer pipe 3. The tube 6 extension or retraction relative to the downcomer pipe 3 can be controlled by an automated control system 308 that receives instructions from a control and monitoring computer system 36 (shown in FIG. 2) which receives and processes data from at least some of the inlet sensors 2*a*, 2*b*, 2*c* and/or the vessel sensors discussed herein. The control and monitoring computer system 36 may be configured to automatically send a control signal to the automated control system 308 in response to the sensor data provided by the inlet sensors and/or vessel sensors. The control and monitoring system 36 analyzes the sensor data and may employ algorithms or other means for determining an optimal length of the tube 6 to maximize potassium chloride, or other mineral yields and to obtain crystals with a desired size.

In a further aspect, a directional/rotational spin on the circulatory solution (or the combination of the circulatory solution and the feed solution) can be induced as the circulatory solution travels down the telescopic downcomer 6 into the crystal magma bed 7, and/or one or more baffles can be installed within the vessel 5 to direct the fluid. This may induce a rotation of the flow within the vessel 5. As the circulatory and feed solution flows upwards, and the crystal sizes grow, the heavier particles may be pushed outwards to the walls of the vessel 5 by the rotation of the flow within the vessel 5. The heavier particles may be stopped or slowed along the wall of the vessel 5 due to the frictional slowdown of the fluid. The heavier particles may then fall down along the wall of the vessel 5 while the fluid and smaller crystals continue to travel upwards. The heavier particles then move into the crystal magma bed 7 where they can continue to grow and fall to the bottom of the crystal magma bed 7.

A vertical telescopic discharge pipe 8 may be provided extending from a side of the conical bottom of the vessel 5 to a level lower than the crystal magma bed 7. The discharge pipe 8 permits a withdrawal of the desired sized crystals and brine, which is separated from each other externally to the vessel 5 by a crystal screen, or mesh 36. The brine is subsequently returned to be reconditioned before being injected back downhole. The reconditioning involves mixing the recycled fluid with a brine produced from the source well. The option exists to vary an angle, a shape, and/or an aperture of the discharge pipe 8 to modify one or more flow characteristics of the withdrawn fluid/crystals thereby controlling the solids withdrawal characteristics in order to provide optimal withdrawal of solids. At a base of the conical portion of the vessel 5, a cleanout drain 9 may be provided for maintenance and cleaning out the crystallizer 100. Similar to the telescopic tube 6, the discharge pipe 8 and/or the drain pipe 9 may each be equipped with an automated control system 308 that receive instructions from the control and monitoring computer system 36 which receives and processes data from at least some of the sensors discussed herein.

A first portion of the first saturated solution, after passing the crystal magma bed 7, flows over a first funnel shaped baffle 10 at or near a top of the collector 102 and into a downward directed pipe 13 of the circulatory system. A second portion of the first saturated solution flows over a second funnel shaped baffle 11 at or near the top of the collector 102 and is conveyed upwardly into the cooling tower 101 by a centrifugal pump 12. Similar to that for the telescopic tube 6, the second funnel shaped baffle 11 may be equipped with an automated control system 308 for controlling a positioning and/or an extension of the funnel shaped baffle 11. The automated control system 308 receives instructions from the control and monitoring computer system 36 based on the data received from at least some of the sensors discussed herein.

The second portion of the first saturated solution is conveyed to a misting system 130 located at or near the top of the cooling tower 101. The misting system 130 receives the first saturated solution along with compressed air from compressed air tanks 22 to produce atomized mist. The atomized mist may be provided to the cooling tower 101 through atomizing fan nipples 14 thereby forming a fan shaped mist. The mist descends downwardly over a plurality of splashboards 15 while encountering an upwardly directed spiraling cool gas stream 132, delivered by fans 16 located near the base of the cooling tower 101, thereby cooling and evaporating the mist. A second saturated solution is formed as the mist is evaporatively cooled.

The upwardly spiraling gas may comprise ambient air, air derived from compressed air from compressed air tanks 22, air derived from compressed air that has passed through one or more adjustable vortex tubes 21 and exits a cool end of the vortex tubes 21, or any combination thereof. When outside conditions are cooler in temperature, such as during winter climates, ambient air may be the only source required for the upward spiraling gas. Alternatively, if the control system 308 determines that a temperature differential between the second portion of the first saturated solution and the ambient surface air is not sufficient for evaporative cooling to form the desired saturated solution, then an appropriate amount of an alternative cooling source (e.g., air derived from compressed air, air derived from compressed air that has passed through an adjustable vortex tube 21 and has exited a cool end of the vortex tube 21, or any combination thereof) may be employed to at least a portion of the gas to increase the temperature differential between the gas and the second portion of the first saturated solution. The determination and analysis of the temperature differential may occur with the use of the appropriate sensors and the control and monitoring computer system 36 or other control system 308.

The vortex tubes 21 may be a conventional vortex tube that is a mechanical device to separate a compressed gas into a hot stream and a cold stream. Typically, the pressurized gas is injected tangentially into a vortex tube swirl chamber (not shown) and is rotationally accelerated at a high rate. Due to a conical nozzle at the end of the tube 21, only an outer shell of the compressed gas is allowed to escape at that end. The remainder of the gas is forced to return in an inner vortex of reduced diameter within the outer vortex.

One or more fans 16 may be equipped with temperature sensors 16*a* and an automated velocity and orientation control system 308 that are controlled by the control and monitoring computer system 36 similarly to that described above. The fans 16 may also be equipped with filters for cleaning the air entering the cooling tower 101.

In some exemplary embodiment, one or more sensors may be provided for measuring the mist (or the second portion of the first saturated solution) and/or the ambient air temperature. Information from the sensors is provided, either via wired or wireless means, to the control and monitoring computer system 36. The control and monitoring computer system 36 is configured to determine the temperature differential between the mist (or the second portion of the first saturated solution) and the ambient surface air temperature. The temperature differential may be used to control the evaporative cooling process of the mist in order to provide an optimal or desired crystallization yields.

When the control and monitoring computer system 36 determines that the temperature differential is not sufficient, the control and monitoring computer system 36 sends a signal comprising control instructions, via wired or wireless means, to an automated control system 308 for employing an appropriate amount of an alternative cooling source (e.g., air derived from compressed air, air derived from oil-free compressed air that has passed through an adjustable vortex tube 21 and has exited a cool end of the vortex tube 21, or any combination thereof) to at least a portion of the gas to increase the temperature differential between the gas and the second portion of the first saturated solution. The control and monitoring computer system 36 may employ algorithms or other means for determining and controlling the components making up the gas.

A bottom funnel member 17 is provided at a bottom of the cooling tower 101. The second saturated solution emitted from the misting system 130 condenses and descends into the funnel member 17. The fans 16 may be configured such that a whirlwind-effect is created causing the second saturated solution contained in the funnel member 17 to constantly spin thereby reducing a risk of the funnel member 17 being blocked by crystal precipitation.

The second saturated solution descends downwardly through the bottom funnel member 17 and mixes with the primary saturated solution in the suspended crystal magma bed 7 in the bottom portion 102 of the vessel 5. As the second saturated solution is cooled due to the evaporatively cooling process described above, the second saturated solution provides a constant and direct cooling effect when mixing with the first saturated solution while in the bottom portion 102 of the vessel 5. Depending on the prevailing cooling and evaporative effect, the flow rate of the feed solution entering into the vessel 5 can be regulated by the flow control device as discussed above. In some aspects, an overflow pipe 20 may be proximate to the top of the bottom funnel member 17 in the event that the bottom funnel member 17 becomes full of the second saturated solution. One or more sensors 20*a,b,c* may take measurements of any overflow fluid and transmit the measurement data to the control and monitoring computer system 36.

A power wash water sprayer 18 may be provided at the top of the tower 101 to allow an addition of fresh and/or brackish water to offset evaporation of the mist or to wash the tower 101 when required. A pollution control screen 19 may be provided between the nipples 14 and the sprayer 18 which permits the evacuation of gases containing evaporated solvent while blocking entry to dust and outside impurities.

Figure 3:
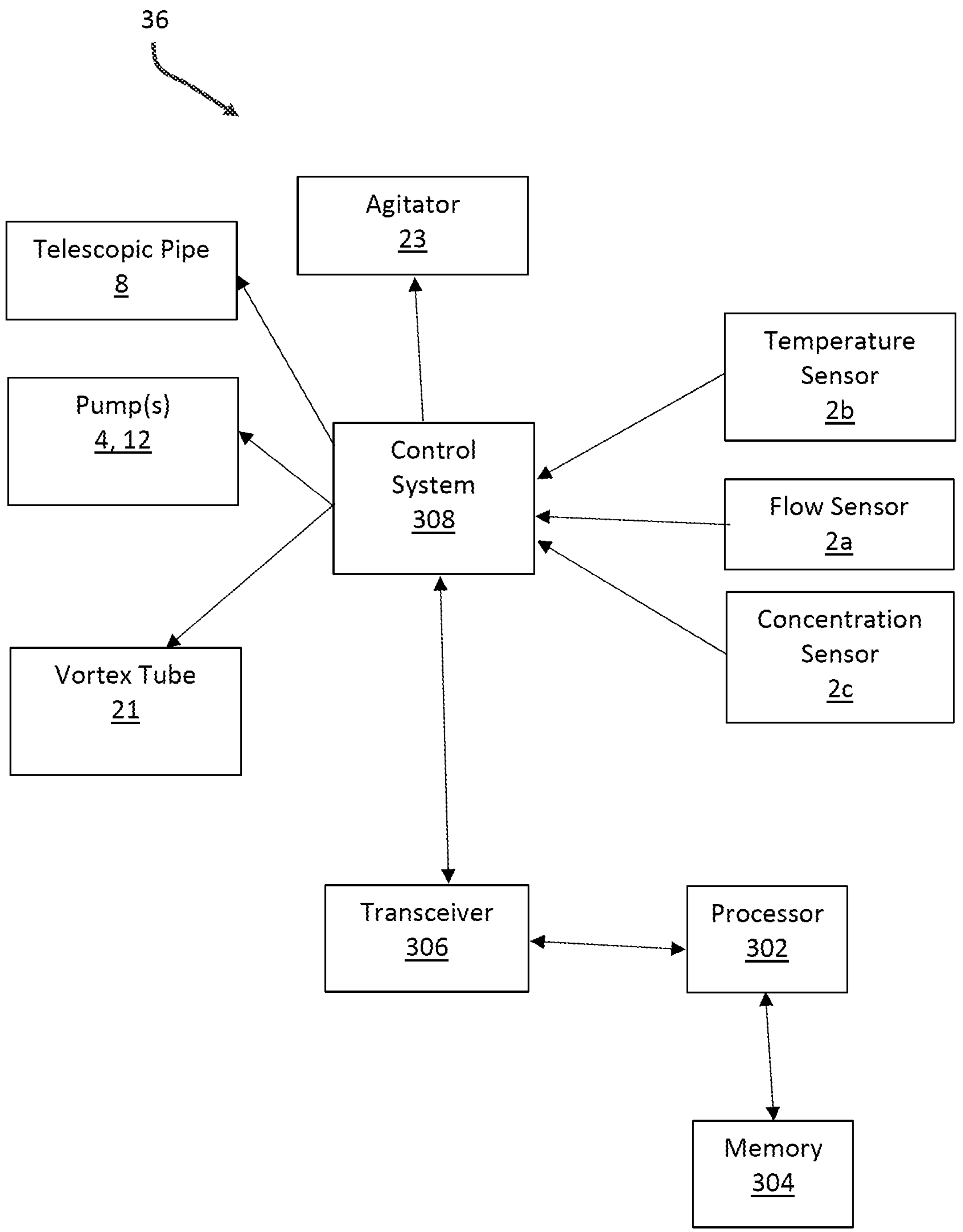
FIG. 3 is a schematic illustration of a computer implemented control system for the crystallizer.

Turning to FIG. 3, the control and monitoring computer system 36 may comprise a processor 302 executing one or more instructions from a computer-readable memory 304. The processor 302 may communicate with the control system 308 via the transceiver 306. As described herein, the control system 308 may read temperature data, flow data, and/or concentration data from one or more temperature sensors 2*b*, one or more flow sensors 2*a*, and/or one or more concentration sensors 2*c* respectively. The control system 308 may, in response to the sensor data, control one or more of the vortex tubes 21, the pumps 4, 12, a length of the telescopic pipe 8, and/or the agitator. The communication and the relaying of information between the control and monitoring computer system 36, the automated control system(s) 308, and/or the sensors described herein could occur via wired or wireless technologies, such as a transceiver 306, and may be manually or automatically operable. Although FIG. 3 shows the control system 308 independent of the processor 302, in some aspects, the control system instructions may execute on the processor 308 and/or vice versa.

According to some aspects, feed solutions may be sourced from a primary evaporative pond or tank (typically referred to as a "concentration pond" or a "buffer cooling pond or tanks") located between the outflow from a mining field and the inlet of a process plant. Initially, the mining solution from the mine field is transported to the evaporative pond/tank whereby atmospheric circulation, solar energy, and/or induced circulation using a paddle agitation system, spray booms, vac truck, or any combination thereof, causes evaporation of water from the evaporative pond or tank resulting in a highly concentrated solution of a desired mineral. Utilizing such highly concentrated solutions as a feed solution for the crystallizers 100 may increase an efficiency of crystallization of the desired product.

According to some embodiments of the present invention, the crystallizers 100 are operated closest to an eutectic line to produce the desired crystal component in the circulating fluid as long as the temperature differential between feed fluid, introduced circulatory fluid, and the wet bulb temperature is sufficient to produce cooling of the brine that results in precipitation of the desired mineral.

Figure 2:
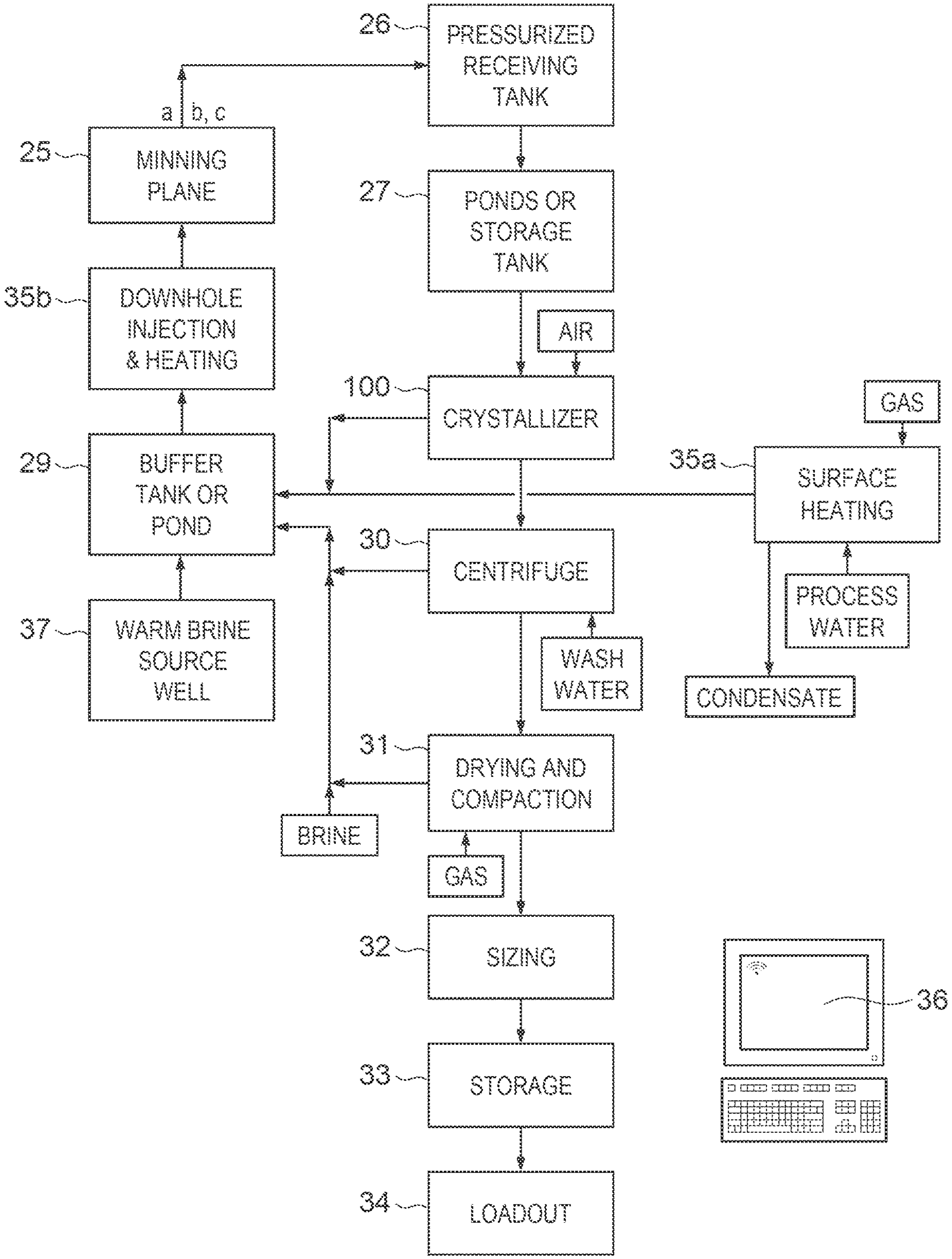
FIG. 2 is a schematic illustration of a system for a surface operation employing a crystallizer.

Turning to FIG. 2, a system 200 for a surface operation employing a crystallizer 100.

A mining solution, composed of fresh process brine and/or feed fluid, from a subterranean mining plane 25 is geothermally heated, artificially heated, or not heated at all. One or more sensors may provide measurement data for the flowrate, temperature and concentration of sodium chloride and therefore potassium chloride of the mining solution flowing from the mining plane 25. The measurement data may ascertain operating parameters of the crystallizer system 100 before being conveyed into a pressurized receiving tank 26. From the receiving tank 26, the solution may be conveyed into a holding pond 27 or an open tank in order to take advantage of the ambient air differential temperatures.

The solution may then be pumped into the crystallizer 100 for processing. The exhausted fluid overflowing from the crystallizer 100 may be heated using a surface heater 35*a* that may burn gas or other fuel. The overflow fluid may be stored temporarily in a buffer tank or pond 29 where the overflow fluid may be reconditioned or have more brine added to the overflow fluid from a warm brine source well 37 (or other brine source) before being injected from the tank or pond 29 into the subterranean mining plane 25 by downhole injection and heating 35*b*.

The product discharged from the crystallizer 28 is processed through a centrifuge 30, dried and compacted (at step 31), sized (at step 32), stored (at step 33) and finally dispatched at loadout (at step 34). Natural gas or other suitable heat sources may be used for drying (at step 31), steam tracing and space heating. Waste heat retained is utilized to heat process water only to the extent the waste heat is available. After leaving the buffer tank or pond 29, the brine solution can be further heated by downhole injection heating 35*b*, such as geothermal, artificial or a combination of both.

As will be clear to those skilled in the art, numerous advantages are made possible with the present invention, in the exemplary embodiments presented herein and other embodiments falling within the scope of the present invention as described.

For example, the use of adjustable pipes, tubes, baffles and other adjustable components in conjunction with sensors, control and monitoring systems, and automated control means allows for optimal crystallization yields of a desired product. The use of an alternative cooling system to assist in evaporative cooling of a feed solution may allow for better crystallization yields of a desired product despite unfavorable ambient air temperatures such as in the summer.

Unless the context clearly requires otherwise, throughout the description and the claims:

"comprise", "comprising", and the like are to be construed in an inclusive sense, as opposed to an exclusive or exhaustive sense; that is to say, in the sense of "including, but not limited to".

"connected", "coupled", or any variant thereof, means any connection or coupling, either direct or indirect, between two or more elements; the coupling or connection between the elements can be physical, logical, or a combination thereof.

"herein", "above", "below", and words of similar import, when used to describe this specification shall refer to this specification as a whole and not to any particular portions of this specification.

"or", in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

Where a component (e.g. a circuit, module, assembly, device, drill string component, drill rig system etc.) is referred to herein, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of methods and apparatus have been described herein for purposes of illustration. These are only examples. The technology provided herein can be applied to contexts other than the exemplary contexts described above. Many alterations, modifications, additions, omissions and permutations are possible within the practice of this invention. This invention includes variations on described embodiments that would be apparent to the skilled person, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

The foregoing is considered as illustrative only of the principles of the invention. The scope of the claims should not be limited by the exemplary embodiments set forth in the foregoing but should be given the broadest interpretation consistent with the specification as a whole.

The invention claimed is:

1. A crystallizer comprising:

a vessel with a cooling tower and a collector;

at least one vortex tube providing an adjustable cool air source to the cooling tower;

an inlet to receiving a feed solution into the collector;

a downcomer pipe extending below a suspended crystal bed within the collector and coupled to the inlet; and a circulation system providing a circulatory solution to the feed solution to form a saturated solution.

2. The crystallizer according to claim 1, wherein the circulation system comprises a circulation pump to circulate the circulatory solution received from a top of the collector to between the inlet and the downcomer pipe.

3. The crystallizer according to claim 1, wherein the circulatory solution is a lower temperature than the feed solution.

4. The crystallizer according to claim 1, wherein the suspended crystal bed corresponds to a supersaturated region.

5. The crystallizer according to claim 1, wherein a ratio of the feed solution to the circulatory solution is about 1:10 to about 1:60.

6. The crystallizer according to claim 1, further comprising an agitator below the suspended crystal bed and providing an upward flow within the collector.

7. The crystallizer according to claim 1, further comprising a telescopic tube extending from the downcomer pipe.

8. The crystallizer according to claim 1, wherein a rotational spin about a central axis of the vessel is induced on the saturated solution.

9. The crystallizer according to claim 1, further comprising a discharge pipe extending from the collector and providing at least one crystal to a mesh to separate the at least one crystal from the saturated solution.

10. The crystallizer according to claim 1, further comprising a misting system within the cooling tower.

11. The crystallizer according to claim 10, further comprises a pump providing a portion of the saturated solution from the collector to the misting system.

12. The crystallizer according to claim 11, wherein the misting system comprises a tank providing compressed air into the portion of the saturated solution to provide an atomized mist via a plurality of nipples.

13. The crystallizer according to claim 1, wherein the at least one vortex tube generates an upwardly spiraling gas within the cooling tower.

14. The crystallizer according to claim 13, wherein the adjustable cool air source is selected from: an ambient air, a compressed air, and a combination of the ambient air and a compressed air.

15. A method of producing crystals from a feed solution, the method comprises:

receiving the feed solution into a vessel via an inlet;

mixing a circulatory solution with the feed solution prior to a downcomer pipe within a collector of the vessel to product a saturated solution;

extending the downcomer pipe to below a suspended crystal bed within the collector;

generating a temperature differential between a cooling portion of the vessel and the collector of the vessel;

providing an adjustable cool air source with at least one vortex to a cooling tower;

precipitating the crystals from the saturated solution within the collector; and separating the crystals from the saturated solution.

16. The method according to claim 15, the method further comprises circulating the circulatory solution from a top of the collector to between the inlet and the downcomer pipe.

17. The method according to claim 15, the method further comprises reducing a circulatory solution temperature to be below a feed solution temperature.

18. The method according to claim 15, wherein a ratio of the feed solution to the circulatory solution is about 1:10 to about 1:60.

19. The method according to claim 15, the method further comprises agitating the saturated solution below the suspended crystal bed;

and providing an upward flow within the collector.

20. The method according to claim 15, the method further comprises extending or retracting a telescopic tube from the downcomer pipe.

21. The method according to claim 15, the method further comprises inducing a rotational spin about a central axis of the vessel on the saturated solution.

22. The method according to claim 15, the method further comprises withdrawing the crystals from a discharge pipe extending from the collector; and separating the crystals with a mesh from the saturated solution.

23. The method according to claim 15, the method further comprises pumping a portion of the saturated solution from the collector to a misting system.

24. The method according to claim 23, the method further comprises atomizing the portion of the saturated solution and providing atomized mist to the cooling portion of the vessel.

25. The method according to claim 15, further comprises generating an upwardly spiraling gas within the cooling tower with the at least one vortex.

26. The method according to claim 25, wherein the adjustable cool air source is selected from: an ambient air, a compressed air, and a combination of the ambient air and a compressed air.

* * * * *